United States Patent
Young

(10) Patent No.: US 7,350,294 B2
(45) Date of Patent: Apr. 1, 2008

(54) METHOD OF ELECTROPLATING A PLURALITY OF CONDUCTIVE FINGERS

(75) Inventor: Robert T. Young, Chandler, AZ (US)

(73) Assignee: Emerson Network Power - Embedded Computing, Inc., Madison, WI (US)

(*) Notice: Subject to any disclaimer, the term of this patent is extended or adjusted under 35 U.S.C. 154(b) by 5 days.

(21) Appl. No.: 11/364,728

(22) Filed: Feb. 27, 2006

(65) Prior Publication Data

US 2007/0199194 A1    Aug. 30, 2007

(51) Int. Cl.
*H05K 3/02*       (2006.01)
(52) U.S. Cl. .............................. 29/846; 29/825; 29/852; 205/125
(58) Field of Classification Search .................. 29/825, 29/846, 852; 205/125
See application file for complete search history.

(56) References Cited

U.S. PATENT DOCUMENTS

| | | | | |
|---|---|---|---|---|
| 4,768,077 A | * | 8/1988 | Scherer | 257/671 |
| 6,348,142 B1 | * | 2/2002 | Vivares et al. | 205/125 |
| 6,359,233 B1 | * | 3/2002 | Joy et al. | 174/255 |
| 6,426,290 B1 | * | 7/2002 | Vivares et al. | 438/678 |

* cited by examiner

*Primary Examiner*—Carl J. Arbes
(74) *Attorney, Agent, or Firm*—Harness, Dickey & Pierce P.L.C.

(57) ABSTRACT

A method of electroplating may include placing a pair of conductive fingers in proximity to an edge of a circuit board, where the pair are coupled to be electrically isolated, and where the pair are substantially longitudinally oriented away from the edge. A trace electrically couples the pair of conductive fingers via a shortest path between the pair of conductive fingers. A plating bar is electrically coupled to one of the pair of conductive fingers and thereafter electroplating the pair of conductive fingers via the plating bar. Subsequent to electroplating, laser drilling the trace to electrically isolate the pair of conductive fingers.

18 Claims, 2 Drawing Sheets

METHOD OF ELECTROPLATING A PLURALITY OF CONDUCTIVE FINGERS

BACKGROUND OF INVENTION

The conventional process for electroplating conductive fingers of electrical connectors on circuit boards is to extend the fingers beyond the edge of the board and then add a plating bar to electrically connect the fingers. This does not work well when the board design requires shortened fingers that do not extend to the edge of the board. The current method leaves stubs and traces in valuable areas of real estate on the board, and is difficult to implement.

There is a need, not met in the prior art, of a method for electroplating a plurality of conductive fingers that is simple, cost-effective and does not leave stubs and traces on useable circuit board real estate. Accordingly, there is a significant need for a method that overcomes the deficiencies of the prior art outlined above.

BRIEF DESCRIPTION OF THE DRAWINGS

Representative elements, operational features, applications and/or advantages of the present invention reside inter alia in the details of construction and operation as more fully hereafter depicted, described and claimed—reference being made to the accompanying drawings forming a part hereof, wherein like numerals refer to like parts throughout. Other elements, operational features, applications and/or advantages will become apparent in light of certain exemplary embodiments recited in the Detailed Description, wherein:

Elements in the Figures are illustrated for simplicity and clarity and have not necessarily been drawn to scale. For example, the dimensions of some of the elements in the Figures may be exaggerated relative to other elements to help improve understanding of various embodiments of the present invention. Furthermore, the terms "first", "second", and the like herein, if any, are used inter alia for distinguishing between similar elements and not necessarily for describing a sequential or chronological order. Moreover, the terms "front", "back", "top", "bottom", "over", "under", and the like in the Description and/or in the Claims, if any, are generally employed for descriptive purposes and not necessarily for comprehensively describing exclusive relative position. Any of the preceding terms so used may be interchanged under appropriate circumstances such that various embodiments of the invention described herein may be capable of operation in other configurations and/or orientations than those explicitly illustrated or otherwise described.

DETAILED DESCRIPTION OF EXEMPLARY EMBODIMENTS

The following representative descriptions of the present invention generally relate to exemplary embodiments and the inventor's conception of the best mode, and are not intended to limit the applicability or configuration of the invention in any way. Rather, the following description is intended to provide convenient illustrations for implementing various embodiments of the invention. As will become apparent, changes may be made in the function and/or arrangement of any of the elements described in the disclosed exemplary embodiments without departing from the spirit and scope of the invention. The present invention is not limited to implementation by any particular set of elements, and the description herein is merely representational of one embodiment.

The terms "a" or "an", as used herein, are defined as one, or more than one. The term "plurality," as used herein, is defined as two, or more than two. The term "another," as used herein, is defined as at least a second or more. The terms "including" and/or "having," as used herein, are defined as comprising (i.e., open language). The term "coupled," as used herein, is defined as connected, although not necessarily directly, and not necessarily mechanically.

Figure 1:
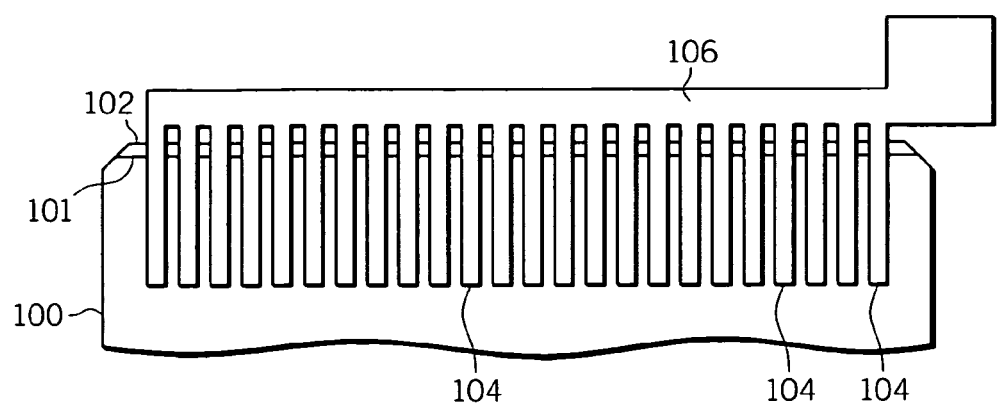
FIG. 1 representatively illustrates a prior art method of electroplating conductive fingers on a circuit board.

FIG. 1 representatively illustrates a prior art method of electroplating conductive fingers 104 on a circuit board 100. The circuit board 100 depicted in FIG. 1 may be an edge connector for mounting the circuit board and electrically connecting conductive fingers 104 to contact elements in a connecting member into which the edge connector may be inserted. More particularly, an edge connector may include contact elements positioned on its surface 101 coupled to engage similar elements or pins in a housing when the edge connected is inserted therein. Upon inserting the edge connector into a slot of connecting member, the fingers electrically engage the contact elements in the connecting member to complete the electrical path from the conductive fingers 104 on the circuit board 100 to the conductive traces in the slot of the connecting member.

Most circuit boards are composed of between one and sixteen conductive layers separated and supported by layers of insulating material (substrates) laminated (glued) together. Layers may be connected together through drilled holes called vias. Either the holes are electroplated or small rivets are inserted to electrically connect the conductive layers. High-density circuit boards may have blind vias, which are visible only on one surface, or buried vias, which are visible on neither.

Low-end consumer grade circuit board substrates frequently are made of paper impregnated with phenolic resin. High-end consumer and industrial circuit board substrates are typically made of a material designated FR-4. This consists of a woven fiberglass mat impregnated with a flame resistant epoxy resin.

The vast majority of circuit boards are made by adhering a layer of copper over the entire substrate, sometimes on both sides, (creating a blank circuit board) then removing unwanted copper after applying a temporary mask (e.g. by etching in an acid), leaving only the desired copper traces. A few circuit boards are made by adding traces to the bare substrate.

Plurality of conductive fingers 104 must be able to withstand repeated insertion and removal of the circuit board into the connecting member. The frictional wear is required to be kept at a minimum. Therefore, the conductive fingers 104, which are often copper, are electroplated with a more robust conductive material such as gold, nickel or some combination thereof.

In a non-limiting example of electroplating, gold plating is often used in electronics to provide a corrosion-resistant electrically conductive layer on copper, typically in electrical connectors and printed circuit boards. With direct gold-on-copper plating, the copper atoms have the tendency to diffuse through the gold layer, causing tarnishing of its surface and formation of an oxide/sulfide layer. A layer of a suitable barrier metal, usually nickel, may therefore be deposited on the copper substrate, forming a copper-nickel-gold sandwich. Both the nickel and gold layers are usually deposited by electroplating.

As is known in the art, electroplating is the coating of an electrically conductive item with a layer of metal using electrical current. The result is a thin, smooth, even coat of metal on the object. The process used in electroplating is called electro-deposition. The item to be coated (circuit board 100) is placed into a container containing a solution of one or more metal salts. The circuit board 100 is connected to an electrical circuit via the plating bar 106, forming the cathode (negative) of the circuit while an electrode typically of the same metal to be plated forms the anode (positive). When an electrical current is passed through the circuit, metal ions in the solution are attracted to the conductive fingers 104. The result is a layer of metal on the conductive fingers 104. The anode and cathode in the electroplating cell are connected to an external supply of direct current, a battery, or more commonly a rectifier. The anode is connected to the positive terminal of the supply, and the cathode (article to be "plated") is connected to the negative terminal, usually via a plating bar 106. When an external power supply is switched on, the metal at the anode is oxidized from the 0 valence state to form cations with a positive charge. These cations associate with the anions in the solution. The cations are reduced at the cathode to deposit in the metallic, 0 valence state.

The conductive fingers 104 shown in FIG. 1 run to the edge 102 of the circuit board 100. This makes the addition of the plating bar 106 for electroplating easy as the conductive fingers 104 are at the edge of the circuit board 100. So when the plating bar 106 is removed after electroplating (often with a portion of the circuit board 100), there are no stubs left and a clean cut is possible.

Figure 2:
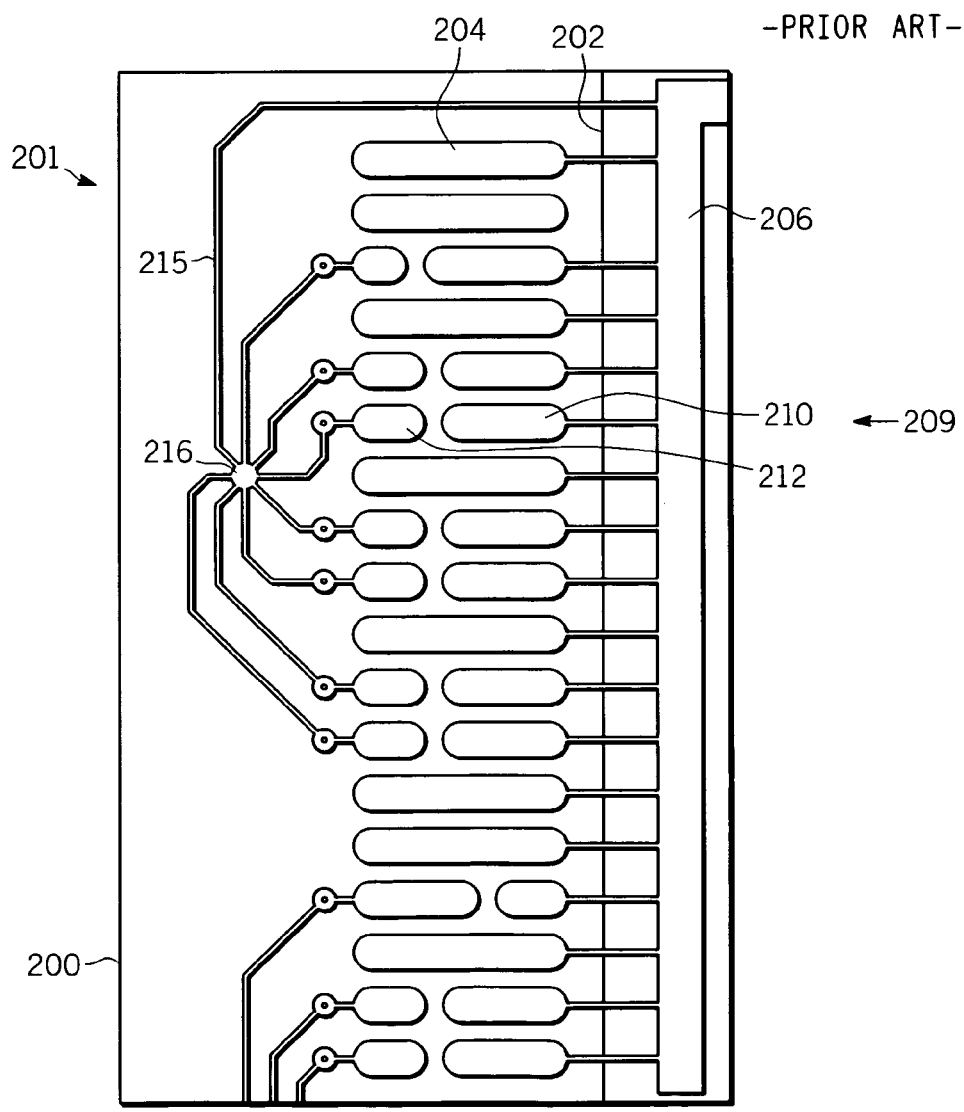
FIG. 2 representatively illustrates another prior art method of electroplating conductive fingers on a circuit board.

FIG. 2 representatively illustrates another prior art method of electroplating conductive fingers 204 on the surface 201 of a circuit board 200. In the circuit board 200 depicted in FIG. 2, a pair of conductive fingers 209 are present with neither at the edge 202 of the circuit board 200. Both the front conductive finger 210 and the rear conductive finger 212 are set back from edge 202. As shown, front conductive finger 210 and rear conductive finger 212 are longitudinally oriented away from edge 202. Pair of conductive fingers 209 may be in substantially in line with each other as shown or substantially offset from each other.

In the prior art, in order to electroplate pair of conductive fingers 209, both front conductive finger 210 and rear conductive finger 212 must be connected to plating bar 206. Front conductive finger 210 may include stubs to edge 202 to connect with plating bar 206 without the stubs taking up useable circuit board real estate. However, each rear conductive finger 212 includes trace 215 to electrically couple itself to a common point 216, which is then electrically coupled to plating bar 206 via a conductive trace. In the alternative, one or more of the rear conductive fingers 212 may be directly connected to plating bar 206 using its own dedicated trace 215. Subsequent to electroplating, a via may be drilled out at common point 216 to electrically isolate each rear conductive finger 212 from plating bar 206.

In the prior art described above, after common point 216 is drilled out, the traces 215 remain on useable circuit board real estate. The traces 215 may be removed, which is a lengthy, manual and expensive process, or they may be left behind, thereby rendering useless that circuit board real estate. Both of these alternatives have the disadvantage of increased expense and reduced efficiency.

Figure 3:
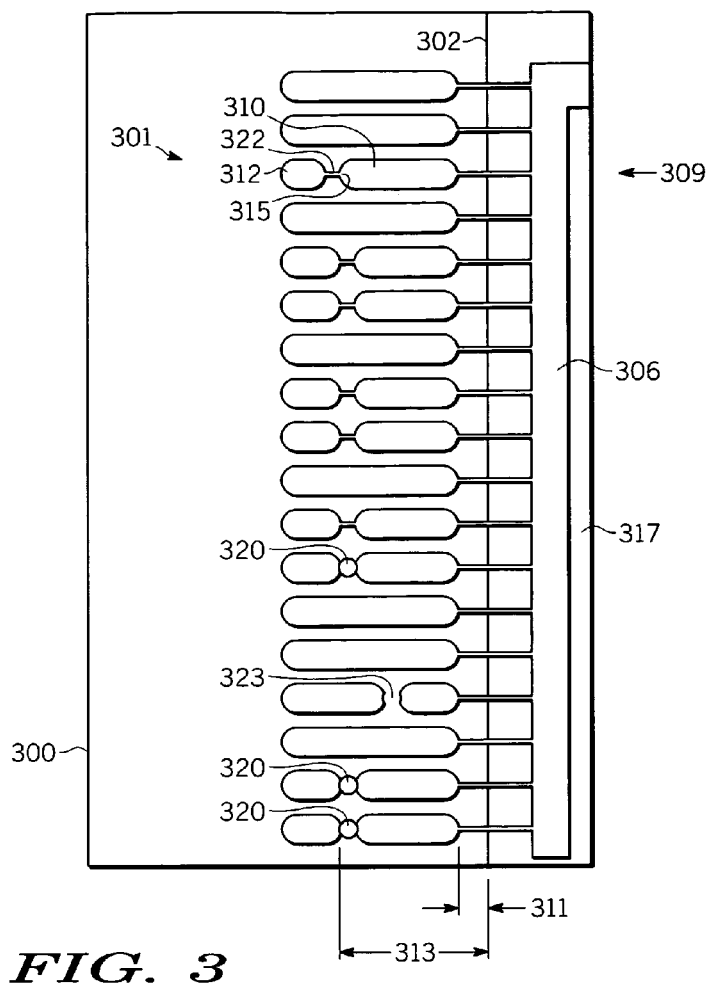
FIG. 3 representatively illustrates a method of electroplating conductive fingers in accordance with an exemplary embodiment of the present invention.

FIG. 3 representatively illustrates a method of electroplating conductive fingers 304 in accordance with an exemplary embodiment of the present invention. The embodiment shown in FIG. 3 includes a circuit board 300 having an edge 302 and a surface 301. On the surface 301 are a plurality of conductive fingers 304.

Plurality of conductive fingers 304 may include any number of pairs of conductive fingers 309 comprising a front conductive finger 310 and a rear conductive finger 312. Pair of conductive fingers 309 are present with neither at the edge 302 of the circuit board 300. Both the front conductive finger 310 and the rear conductive finger 312 are set back from edge 302. In an embodiment, front conductive finger 310 may be inset a first distance 311 from edge 302, while rear conductive finger 312 may be inset a second distance 313 from front edge, where second distance 313 is greater than first distance 311.

As shown, front conductive finger 310 and rear conductive finger 312 are longitudinally oriented away from edge 302. Pair of conductive fingers 309 may be in substantially in line with each other as shown or substantially offset from each other.

Circuit board 300 may also include a plating bar portion 317 that is removable subsequent to electroplating plurality of fingers 304. Plating bar portion 317 includes plating bar 306, which may be used for an electrical connection in the electroplating process described above.

In an embodiment, once plating bar portion 317 is removed, circuit board 300 may be an Advanced Mezzanine Card (AMC) module suitable for use in a MicroTCA chassis, complying with the MicroTCA standard as defined in PICMG® MicroTCA.0 Draft 0.6—Micro Telecom Compute Architecture Base Specification (and subsequent revisions). The embodiment of the invention is not limited to the use of these standards, and the use of other standards is within the scope of the invention.

MicroTCA is a collection of interconnected elements including at least one Advanced Mezzanine Card module, at least one virtual carrier manager (VCM) and the interconnect, power, cooling and mechanical resources needed to support them. A typical prior art MicroTCA system may consist of twelve AMC modules, one (and optionally two for redundancy) virtual carrier managers coupled to a backplane 103. AMC modules are specified in the Advanced Mezzanine Card Base Specification (PICMG® AMC.0 RC1.1 and subsequent revisions). VCM's are specified in the MicroTCA specification—MicroTCA.0 Draft 0.6—Micro Telecom Compute Architecture Base Specification (and subsequent revisions).

AMC modules can be single-width, double-width, full-height, half-height modules or any combination thereof as defined by the AMC specification. A VCM acts as a virtual carrier card which emulates the requirements of the carrier card defined in the Advanced Mezzanine Card Base Specification (PICMG® AMC.0 RC1.1) to properly host AMC modules. Carrier card functional requirements include power delivery, interconnects, Intelligent Platform Management Interface (IPMI) management, and the like. VCM combines the control and management infrastructure, interconnect fabric resources and the power control infrastructure for the AMC modules into a single unit. A VCM comprises these common elements that are shared by all AMC modules, on one or more AMC modules, or a combination thereof.

The circuit board 300 is not limited to being an AMC module and can be any circuit board having two or more conductive fingers inset a distance from an edge of the circuit board.

As shown in FIG. 3, a trace 315 electrically couples front conductive finger 310 and rear conductive ginger 312 via a shortest path 322 between front conductive finger 310 and conductive finger 312. Trace 315 may be placed at the same time, prior to, or after the pair of conductive fingers 309 are placed on circuit board 300. Trace 315 may be any conductive material such that front conductive finger 310 and rear conductive finger 312 are electrically coupled.

Front conductive fingers 310 may be electrically coupled to plating bar 306 via additional traces as shown. Once traces 315 are in place, plating bar may be electrically coupled to plurality of fingers 304 without the additional traces over the circuit board as shown in the prior art. This has the advantage of not wasting valuable and useable circuit board real estate and not having to remove the additional trace lines shown in FIG. 2.

Circuit board 300 may then have plurality of conductive fingers 304 electroplated by attaching plating bar 306 to an electrical source as described above. Plurality of conductive fingers 304 may be electroplated with a conductive material to suite a particular application. For example and without limitation, plurality of conductive fingers 304 may be electroplated with gold, nickel or a combination of gold and nickel to provide plurality of conductive fingers 304 resistance to wear.

Subsequent to electroplating, trace 315 may be removed by laser drilling 320 using, for example and without limitation, a laser via drill such as a high-density interconnect (HDI) laser drill, a non-plated laser drill (NPLD), and the like. Unlike conventional HDI laser drilling, in the present embodiment the via created with the laser drilling of the trace is not plated, so the pair of conductive fingers 304 are electrically isolated from each other. Effectively, the laser drilling destroys, in part or in whole, the trace 315 and severs the trace 315 so that the pair of conductive fingers 304 is electrically isolated. Since trace 315 was placed on the shortest path 322 between the pair of conductive fingers 304, trace 315 is easily severed using laser drilling. This leaves two longitudinally oriented conductive fingers 323 that are electroplated and electrically isolated from each other, without leaving behind unwanted electrical traces or having to remove unwanted electrical traces.

Also subsequent to electroplating, plating bar 306 and plating bar portion 317 may be severed from circuit board 300. This now permits the use of circuit board 300 in uses, for example, as an AMC module described above.

Figure 4:
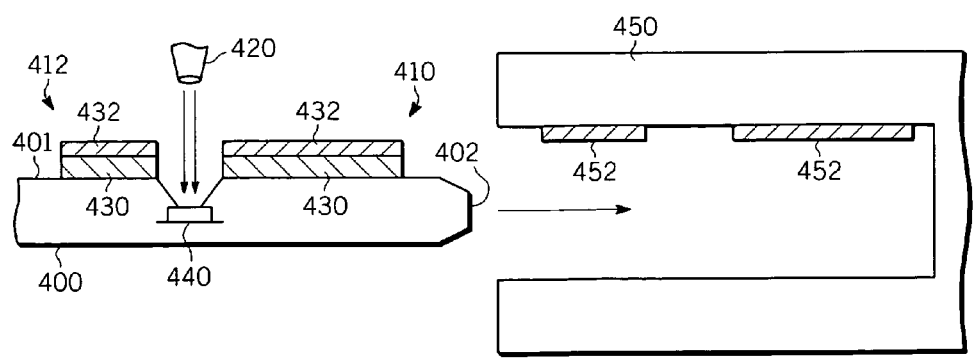
FIG. 4 further representatively illustrates a method of electroplating conductive fingers in accordance with an exemplary embodiment of the present invention.

FIG. 4 further representatively illustrates a method of electroplating conductive fingers in accordance with an exemplary embodiment of the present invention. As shown in FIG. 4, a circuit board 400 having an edge 402 and surface 401 with a front conductive finger 410 and a rear conductive finger 412 on the surface 401. In an embodiment, each of front conductive finger 410 and the rear conductive finger 412 are comprised of a first conductive material 430, and are electroplated with a second conductive material 432. The first conductive material 430 may be copper, and the like. The second conductive material may be nickel, gold, a combination of nickel and gold, and the like. The invention is not limited to one electroplated material (second conductive material 432). Any number of conductive materials and any number of layers may be electroplated and be within the scope of the invention.

In an embodiment, laser drill 420 may be used to sever and/or destroy trace 315 by drilling substantially down to a capture pad 440 in circuit board 400. In the prior art, the via created by laser drilling is plated with a conductive material to electrically couple first conductive finger 410 and second conductive finger 412 to each other and/or to capture pad 440. In the present embodiment, the via created by laser drilling is not electroplated and first conductive finger 410 and second conductive finger 412 are not electrically coupled to each other or capture pad 440.

In embodiment, edge 402 of the circuit board 400 is coupled to electrically interface with a connecting member 450 such as a slot, motherboard, and the like. In an embodiment, circuit board 400 is an edge connector coupled to be inserted into the connecting member 450. First conductive finger 410 and second conductive finger 412 are coupled to interface with electrical pads 452 in connecting member.

In the foregoing specification, the invention has been described with reference to specific exemplary embodiments. However, it will be appreciated that various modifications and changes may be made without departing from the scope of the present invention as set forth in the claims below. The specification and figures are to be regarded in an illustrative manner, rather than a restrictive one and all such modifications are intended to be included within the scope of the present invention. Accordingly, the scope of the invention should be determined by the claims appended hereto and their legal equivalents rather than by merely the examples described above.

For example, the steps recited in any method or process claims may be executed in any order and are not limited to the specific order presented in the claims. Additionally, the components and/or elements recited in any apparatus claims may be assembled or otherwise operationally configured in a variety of permutations to produce substantially the same result as the present invention and are accordingly not limited to the specific configuration recited in the claims.

Benefits, other advantages and solutions to problems have been described above with regard to particular embodiments; however, any benefit, advantage, solution to problem or any element that may cause any particular benefit, advantage or solution to occur or to become more pronounced are not to be construed as critical, required or essential features or components of any or all the claims.

Other combinations and/or modifications of the above-described structures, arrangements, applications, proportions, elements, materials or components used in the practice of the present invention, in addition to those not specifically recited, may be varied or otherwise particularly adapted to specific environments, manufacturing specifications, design parameters or other operating requirements without departing from the general principles of the same.

I claim:

1. A method of electroplating, comprising:
   on a surface of a circuit board, wherein the circuit board is coupled to electrically interface with a connecting member, placing a front conductive finger inset a first distance from an edge;
   on the surface, placing a rear conductive finger inset a second distance from the edge, where the second distance is larger than the first distance;

a trace electrically coupling the front conductive finger to the rear conductive finger via a shortest path between the front conductive finger and the rear conductive finger;

electrically coupling a plating bar to the front conductive finger;

electroplating the front conductive finger and the rear conductive finger via the plating bar; and subsequent to electroplating, laser drilling the trace to electrically isolate the front conductive finger from the rear conductive finger.

2. The method of claim 1, wherein the rear conductive finger is substantially in line with the front conductive finger.

3. The method of claim 1, wherein the rear conductive finger is substantially offset from the front conductive finger.

4. The method of claim 1, wherein the front conductive finger and the rear conductive finger are comprised of a first conductive material, and wherein electroplating comprises electroplating with a second conductive material.

5. The method of claim 1, wherein laser drilling comprises using a laser via drill to sever the trace.

6. The method of claim 5, wherein the laser via drill drilling substantially to a capture pad beneath the surface of the circuit board.

7. The method of claim 1, further comprising subsequent to electroplating, severing the plating bar from the front conductive finger.

8. The method of claim 1, wherein the circuit board is an edge connector coupled to be inserted into the connecting member.

9. The method of claim 1, wherein the circuit board is an Advanced Mezzanine Card (AMC) module.

10. A method of electroplating, comprising:

placing a pair of conductive fingers in proximity to an edge of a circuit board, wherein the pair are coupled to be electrically isolated, wherein the pair are substantially longitudinally oriented away from the edge and wherein the circuit board is coupled to electrically interface with a connecting member;

a trace electrically coupling the pair of conductive fingers via a shortest path between the pair of conductive fingers;

electrically coupling a plating bar to one of the pair of conductive fingers;

electroplating the pair of conductive fingers via the plating bar; and subsequent to electroplating, laser drilling the trace to electrically isolate the pair of conductive fingers.

11. The method of claim 10, wherein the pair of conductive fingers are substantially in line with one another.

12. The method of claim 10, wherein the pair of conductive fingers are substantially offset from one another.

13. The method of claim 10, wherein the pair of conductive fingers are comprised of a first conductive material, and wherein electroplating comprises electroplating with a second conductive material.

14. The method of claim 10, wherein laser drilling comprises using a laser via drill to sever the trace.

15. The method of claim 14, wherein the laser via drill drilling substantially to a capture pad beneath a surface of the circuit board.

16. The method of claim 10, further comprising subsequent to electroplating, severing the plating bar from the one of the pair of conductive fingers.

17. The method of claim 10, wherein the circuit board is an edge connector coupled to be inserted into the connecting member.

18. The method of claim 10, wherein the circuit board is an Advanced Mezzanine Card (AMC) module.

* * * * *